(12) United States Patent
Sun

(10) Patent No.: US 12,218,582 B2
(45) Date of Patent: *Feb. 4, 2025

(54) CHARGE MODE CONTROL FOR POWER FACTOR CORRECTION CIRCUIT

(71) Applicant: TEXAS INSTRUMENTS INCORPORATED, Dallas, TX (US)

(72) Inventor: Bosheng Sun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/207,177

(22) Filed: Jun. 8, 2023

(65) Prior Publication Data

US 2023/0353044 A1 Nov. 2, 2023

Related U.S. Application Data

(63) Continuation of application No. 17/490,104, filed on Sep. 30, 2021, now Pat. No. 11,705,808.

(Continued)

(51) Int. Cl.
*H02M 1/42* (2007.01)
*G01R 19/02* (2006.01)
(Continued)

(52) U.S. Cl.
CPC .......... *H02M 1/4225* (2013.01); *G01R 19/02* (2013.01); *H02M 7/2176* (2013.01); *H02M 1/42* (2013.01); *H02M 3/156* (2013.01); *H02M 7/217* (2013.01)

(58) Field of Classification Search
CPC ...... H02M 1/007; H02M 1/42; H02M 1/4208; H02M 1/4225; H02M 7/217; H02M 3/156; G01R 19/08
See application file for complete search history.

(56) References Cited

U.S. PATENT DOCUMENTS 7,990,740 B1 8/2011 Notohamiprodjo et al.
8,503,205 B2 8/2013 Carletti et al.
(Continued)

OTHER PUBLICATIONS

Ganacim, Julio Cesar Secolo et al: "Output power feedforward technique applied to a high power factor rectifier with high frequency transformer," 2013 Brazilian Power Electronics Conference, IEEE, Oct. 27, 2013, pp. 406-413, XP032585532, ISSN: 2175-8603, DOI: 10.1109/COBEP.2013.6785148.

(Continued)

*Primary Examiner* — Gary L Laxton
(74) *Attorney, Agent, or Firm* — Charles F. Koch; Frank D. Cimino

(57) ABSTRACT

A control circuit for a power factor correction (PFC) circuit, the control circuit includes a multiplier having first, second, and third multiplier inputs and a multiplier output. The control circuit has an adder having first and second inputs and an output. The first input of the adder is coupled to the multiplier output. The control circuit further includes a root mean square (RMS) calculation circuit configured to determine a square of a root mean square of an input sinusoidal voltage. The RMS calculation circuit has an output coupled to the second multiplier input. An input voltage square calculation circuit is configured to determine a square of the input sinusoidal voltage. The input voltage square calculation circuit has an output coupled to the third multiplier input.

20 Claims, 10 Drawing Sheets

Related U.S. Application Data

(60) Provisional application No. 63/183,990, filed on May 4, 2021.

(51) Int. Cl.
*H02M 7/217* (2006.01)
*H02M 3/156* (2006.01)

(56) References Cited

U.S. PATENT DOCUMENTS

| | | |
|---|---|---|
| 9,537,385 B2 | 1/2017 | Pu et al. |
| 10,038,368 B2 | 7/2018 | Mei et al. |
| 11,705,808 B2 * | 7/2023 | Sun .................. G01R 19/02 363/89 |
| 2005/0007083 A1 * | 1/2005 | Yang .................. H02M 1/4225 323/282 |
| 2009/0160571 A1 * | 6/2009 | Tai .................... H03K 7/08 332/109 |
| 2012/0236612 A1 | 9/2012 | Uno |
| 2012/0300517 A1 | 11/2012 | Zhang et al. |
| 2019/0305664 A1 | 10/2019 | Iyasu et al. |

OTHER PUBLICATIONS

Zhao, Wencheng, et al: "A Digital Control Method with Feedforward Reconstruction for Improved Sampling Interference Suppression in GaN HEMTs based Totem-pole PFC Converters," 2018 1st Workshop on Wide Bandgap Power Devices and Applications in Asia (WIPDA Asia), IEEE, May 16, 2018, pp. 1-6, XP033560346, DOI: 10.1109/WIPDAASIA.2018.8734613.

Gong, Xun, et al: "6.6KW Three-Phase Interleaved Totem Pole PFC Design with 98.9% Peak Efficiency for HEV/EV Onboard Charger," 2019 IEEE Applied Power Electronics Conference and Exposition (APEC), IEEE, Mar. 17, 2019, pp. 2029-2034, XP033555146, DOI: 10.1109/APEC.2019.8722110.

* cited by examiner

CHARGE MODE CONTROL FOR POWER FACTOR CORRECTION CIRCUIT

CROSS-REFERENCE TO RELATED APPLICATIONS

This application is a continuation of U.S. patent application Ser. No. 17/490,104 filed Sep. 30, 2021, which claims priority to U.S. Provisional Application No. 63/183,990, filed May 4, 2021, which is hereby incorporated by reference.

BACKGROUND

An alternating current (AC)-to-direct current (DC) converter converts an AC voltage such as a building's AC mains to a DC voltage usable to power electronics. An AC-to-DC converter may include a bridge rectifier. Bridge rectifiers may draw current from the AC mains in short, high-magnitude pulses. In an ideal system, the power drawn from the AC mains is utilized to do useful work. This is only possible when the AC current is in phase with the AC voltage. When the phase between current and voltage varies (as would occur with the use of a bridge rectifier), some of the current from the AC mains does not perform useful work. Accordingly, an AC-to-DC converter also may include a power factor correction (PFC) circuit. The PFC circuit functions to ensure that the AC input current to the converter is closer to sinusoidal in shape and in-phase with the AC voltage. A PFC circuit thus shapes the input current to maximize the real power (as opposed to the reactive power).

SUMMARY

In one example, a control circuit is disclosed for a power factor correction (PFC) circuit. The control circuit includes a multiplier having first, second, and third multiplier inputs and a multiplier output. The control circuit has an adder having first and second inputs and an output. The first input of the adder is coupled to the multiplier output. The control circuit further includes a root mean square (RMS) calculation circuit configured to determine a square of a root mean square of an input sinusoidal voltage. The RMS calculation circuit has an output coupled to the second multiplier input. An input voltage square calculation circuit is configured to determine a square of the input sinusoidal voltage. The input voltage square calculation circuit has an output coupled to the third multiplier input.

DETAILED DESCRIPTION

Figure 1:
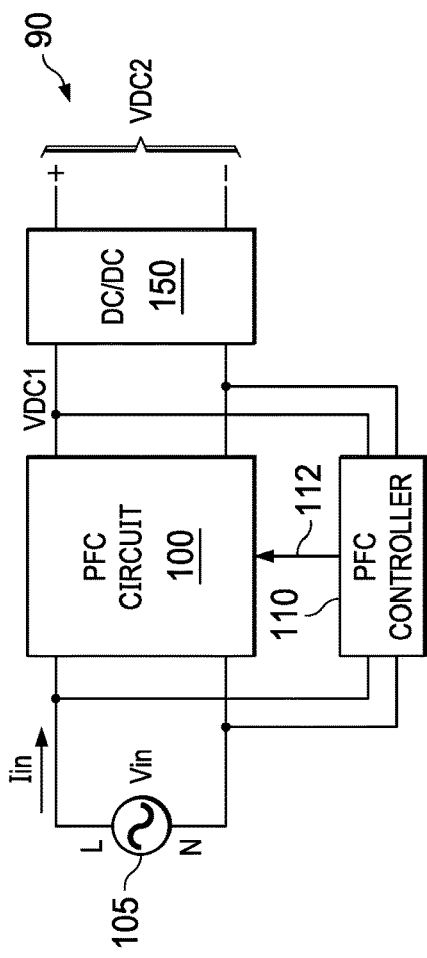
FIG. 1 is a block diagram of an alternating current (AC)-to-direct current (DC) converter which includes a power factor correction (PFC) circuit and a controller for the PFC circuit.

The same reference number is used in the drawings for the same or similar (either by function and/or structure) features.

FIG. 1 is a block diagram of an example AC-to-DC converter 90. The AC-to-DC converter 90 includes a power factor correction (PFC) circuit 100, a DC-to-DC converter 150, and a PFC controller 110. The input to the PFC circuit 100 is an AC voltage (Vin) 105, which may be, for example, the AC mains (e.g., 115 VAC, 220 VAC, etc.). The PFC circuit 100 converts the input voltage, Vin, from an AC voltage to a DC voltage (VDC1). The magnitude of VDC1 is, for example, 400 VDC. The DC-to-DC converter 150 converts its input DC voltage (VDC1) to an output voltage (VDC2). VDC2 may be, for example, 12 V, 48 V, etc. In general, the magnitude of VDC2 is smaller than the magnitude of VDC1.

Figure 2:
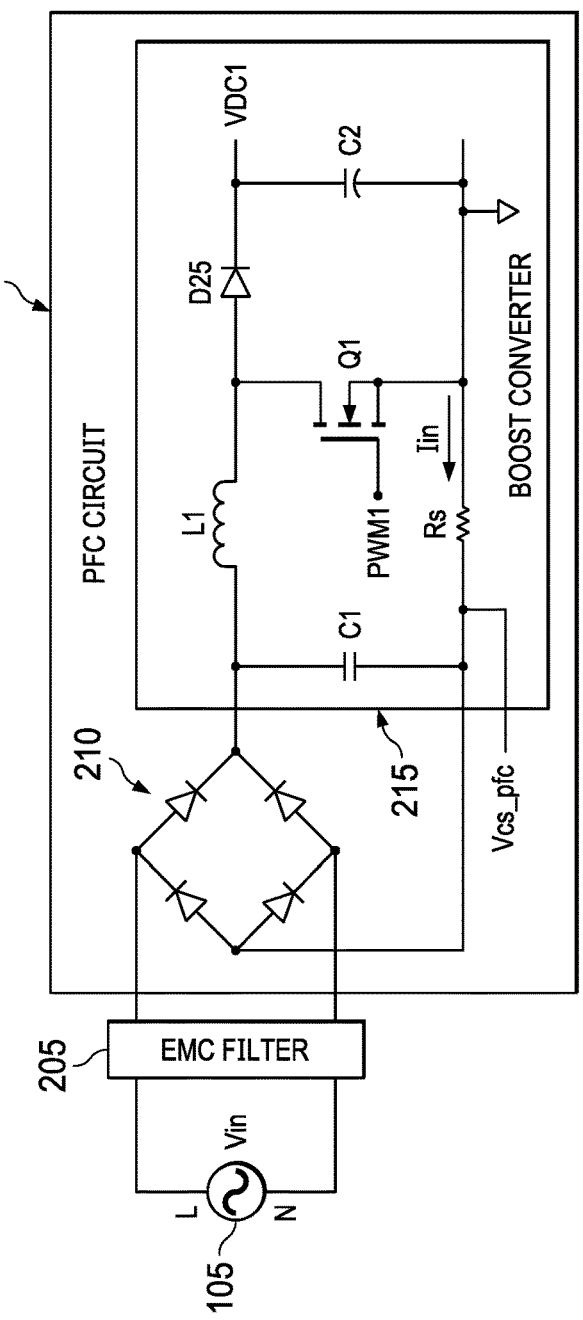
FIG. 2 is a circuit schematic of a PFC circuit in accordance with an example.
Figure 4A:
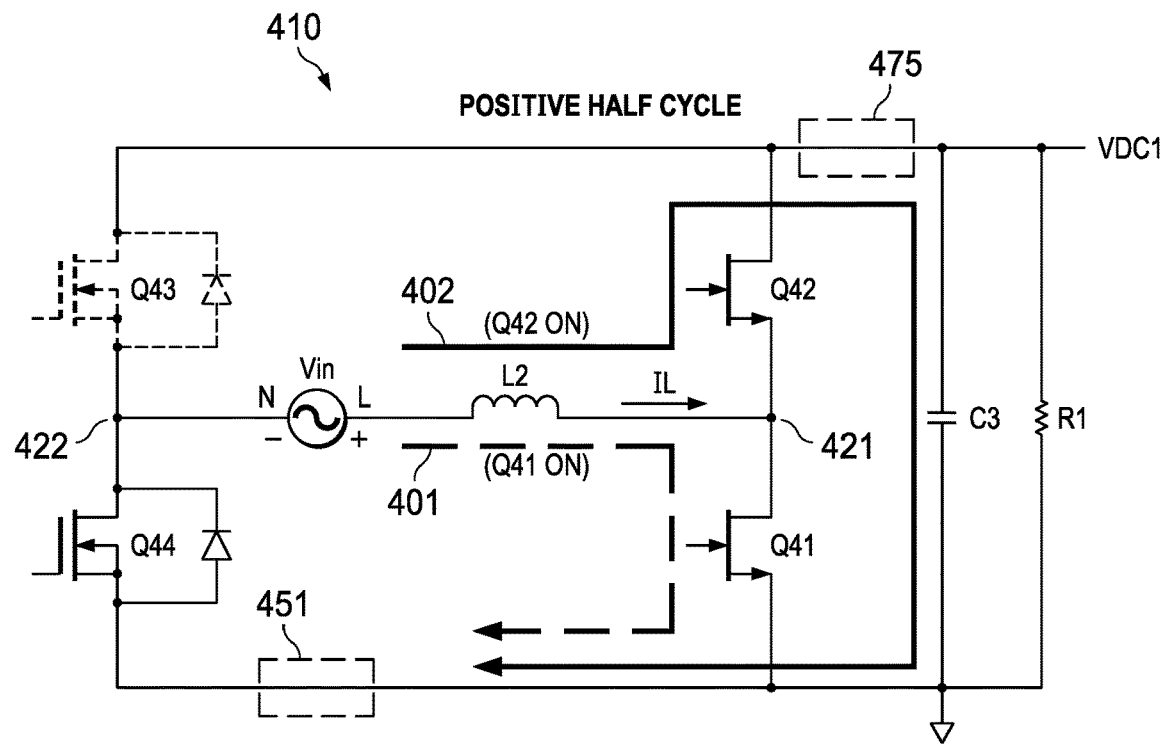
FIGS. 4A and 4B are schematics of a PFC circuit in accordance with another example.
Figure 4B:
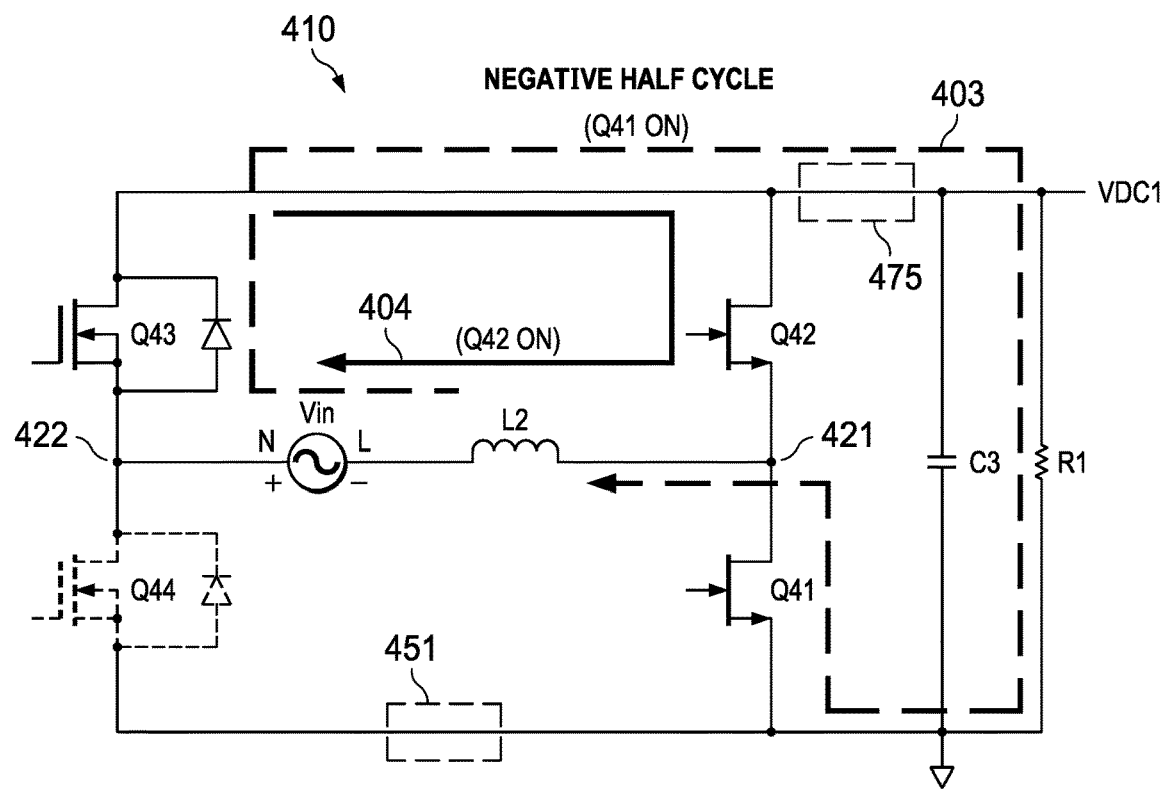

The PFC circuit 100 can be implemented in various ways (illustrated in FIGS. 2, 4A and 4B). Each such implementation, however, includes at least one switch (e.g., a transistor) that must be turned on and off in regulated manner to cause the PFC circuit to perform its intended function, which is to ensure that the input current Iin from remains approximately sinusoidal and in-phase with respect to Vin. The PFC controller 110 generates one or more control signals 112 to control the on and off state of the switch(es) within the PFC circuit 100 in response to one or more input signals such as Vin and VDC1 (the input and output voltages of the PFC circuit 100).

FIG. 2 shows an example of a PFC circuit 100a which includes a rectifier 210 coupled to a boost converter 215. In this example, the rectifier 210 is a four-diode full-wave rectifier. The boost converter 215 includes capacitors C1 and C2, inductor L1, diode D25, and switch Q1. Capacitor C1 is coupled across the output terminals of the bridge 210. Inductor L1 is coupled between one output terminal of the bridge 210 and the anode of diode D25. Switch Q1 is an N-channel metal oxide semiconductor field effect transistor (NMOS transistor) whose drain is coupled to one terminal of inductor L1 and to the anode of diode D25. The source of transistor Q1 is coupled to ground. The cathode of diode D25 is coupled to one terminal of capacitor C2 and provides the output voltage VDC1. A sense resistor Rs is provided in the ground path to provide a voltage proportional to current Iin. resistor Rs is a low resistance resistor (e.g., 10 milliohms).

Figure 3:
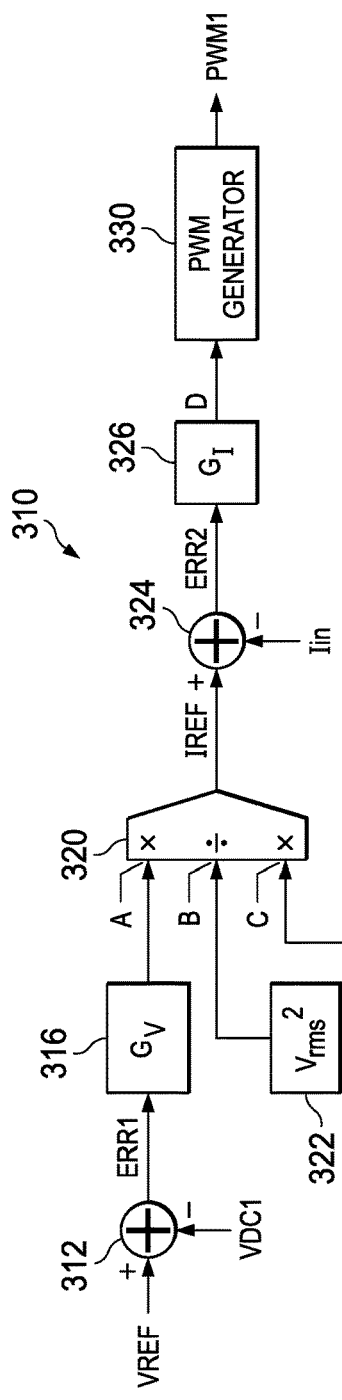
FIG. 3 is a schematic of a PFC controller usable in conjunction with the PFC circuit of FIG. 2.

The transistor Q1 in the boost converter 215 is a switching transistor Q1 that is controlled by the controller 310 of FIG. 3. Referring to FIG. 3, controller 310 includes adders 312 and 324, transconductance amplifiers 316 and 326, a multiplier 320, a root mean square (RMS) calculation circuit 322, and a pulse width modulation (PWM) generator 330. The output signal from the PWM generator 330 is a control signal PWM1. The output of the PWM generator 330 is coupled to the gate of transistor Q1, and thus the output control signal PWM1 is the gate signal to transistor Q1. The input signals to controller 310 include the output voltage from the PFC circuit, VDC1, a voltage signal (generated from a current sensor) proportional to the input current Iin, and the sinusoidal input voltage, Vin (shown in FIG. 3 as Vin (t) to emphasize that it is a time-varying voltage).

Adder 312 subtracts VDC1 from a reference voltage, VREF to thereby generate an error signal ERR1. The error signal ERR1 indicates the voltage difference between VREF and VDC1. The voltage error signal ERR1 is then amplified by transconductance amplifier 316. The output of the transconductance amplifier 316 is coupled to the A input of multiplier 320. The multiplier 320 also includes a B input and a C input. Vin (t) is coupled to the C input. Vin (t) is coupled to an input of the RMS calculation circuit 322. The RMS calculation circuit 322 generates an output DC voltage that is proportional to the square of the root mean square of Vin. The output signal from the RMS calculation circuit 322 is couple to the B input of the multiplier 320. The multiplier 320 multiplies together the signals on its A and C inputs and then divides by the signal on the B input (A×C/B) to produce a current error signal IREF.

Adder 324 subtracts Iin from IREF to produce a second error signal ERR2. ERR2 represents the difference between the current reference IREF and the instantaneous current, Iin. ERR2 is provided to and amplified by transconductance amplifier 326 to produce a signal D to the PWM generator 330. In one embodiment, the PWM generator 330 includes a comparator which compares D (output of transconductance amplifier 326) with a RAMP saw wave to generate a PWM waveform. The higher the magnitude is of D, the bigger will be the width of the PWM pulses and thus the PWM duty cycle will be larger. Similarly, the smaller is the magnitude of D, the smaller will be the PWM duty cycle. The PWM generator 330 controls the duty cycle of transistor Q1 to minimize ERR2 (the difference between IREF and Iin). Accordingly, Iin is controlled to continuously approximately match IREF. IREF is A×C/B. The A input of multiplier 320 is a function of VREF and VDC1, which both are DC-level signals in steady state, and thus the multiplier 320 also receives a DC-level signal. The square of the root mean square of Vin also is a DC-level signal. The only input of the multiplier 320 is Vin (t) on the C input. Thus, the output of multiplier 320, IREF, is a function of Vin (t) which is a sinusoidal voltage. Accordingly, IREF itself is a sinusoidal signal. By causing Iin to closely track IREF, the controller 310 causes Iin to be sinusoidal.

Iin is an input to the controller 310, although Iin in FIG. 3 is Vcs_pfc from FIG. 2 (the voltage across the sense resistor Rs). Thus, for controller 310 to function, a sense resistor is needed. FIGS. 4A and 4B show another example of a PFC circuit 410 for which the inclusion of a sense resistor is problematic. The PFC circuit 410 in FIGS. 4A and 4B is the same circuit but each figure shows the direction of current flow for each half-cycle of the AC waveform. Referring to FIG. 4A, the PFC circuit 410 is a totem-pole circuit in which transistors Q41 and Q42 are connected in series between VDC1 and ground. The PFC circuit 410 also includes transistors Q43 and Q44, capacitor C3, and resistor R1. The source of transistor Q42 and the drain of transistor Q41 are coupled together at node 421. Similarly, the source of transistor Q43 and the drain of transistor Q44 are coupled together at node 422. An inductor L2 has one terminal coupled to node 421. Vin is coupled between node 422 and the opposing terminal of inductor L2 as shown. Capacitor C3 and resistor R1 are coupled in parallel between the drains of transistors Q42 and Q43 (VDC1) and the sources of transistors Q41 and Q44 (ground).

The terminals of Vin are line (L) and neutral (N). During the positive half-cycle of Vin, the line voltage is larger than the neutral voltage. Transistor Q44 is turned on during the positive half-cycle and transistor Q43 is turned off (as indicated by Q43 represented in dashed line). A PFC controller (shown in FIG. 6 and described below) reciprocally toggles transistors Q41 and Q42 on and off at a higher frequency than the line frequency. Transistor Q41 functions as a PFC boost switch. Transistor Q42 functions as a synchronous switch. Transistors Q41 and Q42 are operated in a complementary fashion: when transistor Q41 is on, transistor Q42 is off, and vice versa. The line frequency may be 50 or 60 Hz, while transistors Q41 and Q42 are turned on and off at a frequency significantly higher than that (e.g., 100 KHz).

Transistors Q41 and Q42 are not on simultaneously. In FIG. 4A, arrow 401 represents the direction of current (Iin) flow when transistor Q41 is on, and arrow 402 represents the direction of current flow when transistor Q42 is on. When transistor Q41 is on, the current flows from the line (L) terminal of Vin and through inductor L2 and transistors Q41 and Q44 back to the neutral (N) terminal of Vin. When transistor Q42 is on (and as indicated by arrow 402), the current flows from the line (L) terminal of Vin, through inductor L2 and transistor Q42 to charge capacitor C3, and then from capacitor C3 back through transistor Q44 to the neutral (N) terminal of Vin. If sense resistor was present in the ground leg 451, current would flow through that sense resistor regardless of which transistor Q41 or Q42 is on.

FIG. 4B illustrates the current flow during the negative half-cycle of Vin in which the neutral voltage is larger than the line voltage. Transistor Q43 is turned on during the negative half-cycle and transistor Q44 is turned off (as indicated by Q44 represented in dashed line). Transistors Q41 and Q42 then swap their role, with transistor Q42 functioning as the PFC boost switch, and transistor Q41 functioning as the synchronous switch.

In FIG. 4B, arrow 404 represents the direction of current (Iin) flow when transistor Q42 is on, and arrow 403 represents the direction of current flow when transistor Q41 is on. When transistor Q42 is on, the current flows (see arrow 404) from the neutral (N) terminal of Vin, through transistors Q43 and Q42, and through inductor L2 back to the line (L) terminal of Vin. When transistor Q41 is on (and as indicated by arrow 403), the current flows from the neutral (N) terminal of Vin, through transistor Q43 to charge capacitor C3, and then from capacitor C3 back through transistor Q41, through inductor L1, and to the line (L) terminal of Vin. No current flows through the ground leg 451 during the negative half-cycle and thus there would be no ability to produce a signal proportional to Iin with a sense resistor in the ground leg. Further, placing a sense resistor between the inductor L2 and Vin, or between inductor L2 and node 421 would be complicated because the sense resistor in that configuration would not produce a ground-referenced voltage.

Figure 5:
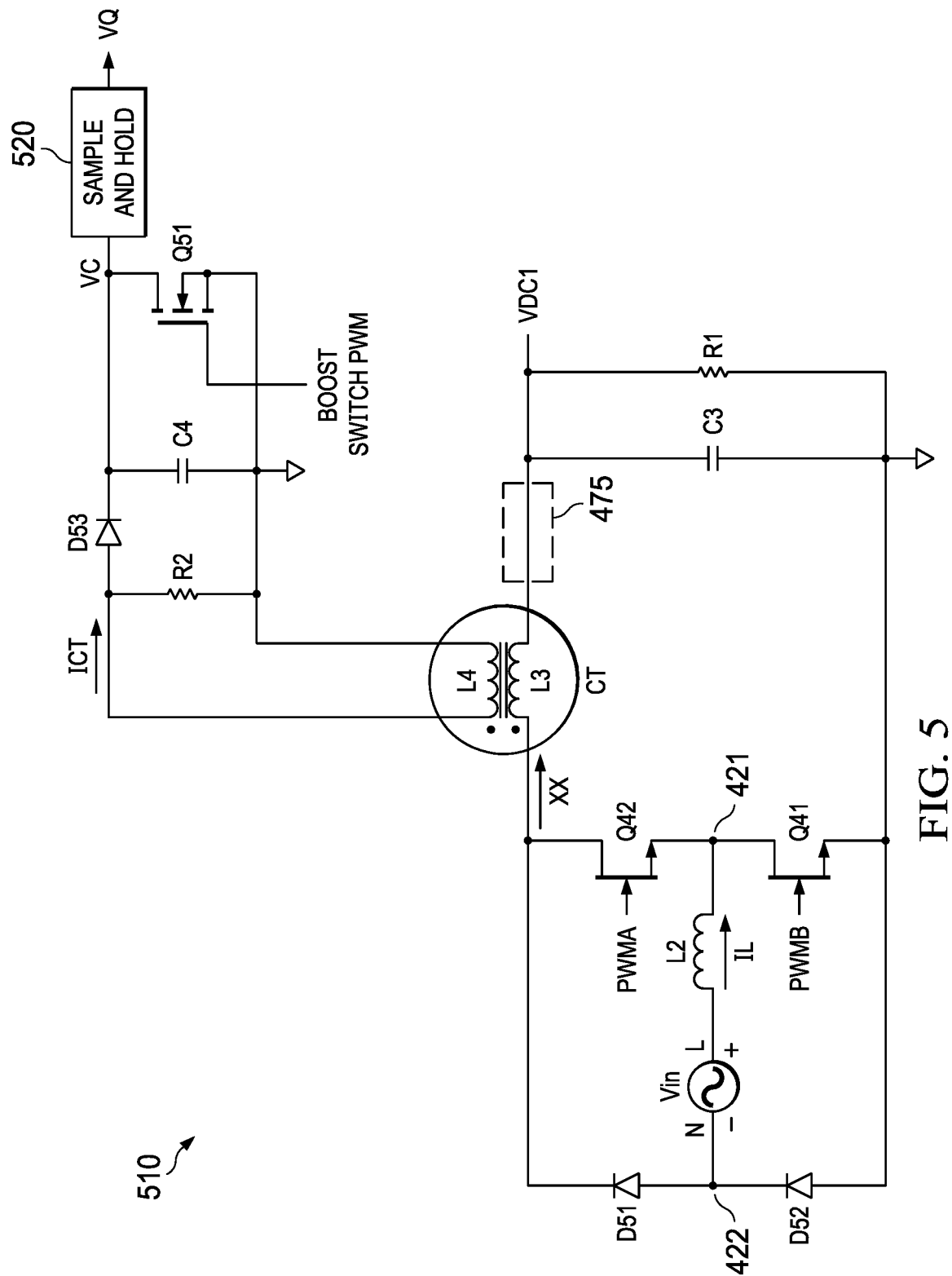
FIG. 5 is a circuit schematic of a PFC circuit including a current transformer and a sample-and-hold in accordance with another example.

FIG. 5 shows an example of a PFC circuit 510 that is similar to PFC circuit 410 in FIG. 4. PFC circuit 510 includes transistors Q41 and Q42 inductor L2, capacitor C3, and resistor R1, as described above. Rather than transistors Q43 and Q44, PFC circuit 510 includes diodes D51 and D52. The operation of the circuit and the current flow, however, is largely the same for PFC circuit 510 as for PFC circuit 410.

PFC circuit 510 also includes a current transformer CT, resistor R2, diode D53, capacitor C4, transistor Q51, and a sample-and-hold circuit 520. The current transformer CT includes a primary winding (L3) that is coupled between the drain of transistor Q42 and capacitor C3. Resistor R2 is coupled across the secondary winding (L4) of the current transformer CT. The anode of diode D53 is coupled to the secondary winding L4, and the cathode of diode D53 is coupled to capacitor C4, the drain of transistor Q51, and to the input of the sample-and-hold 520. The sample-and-hold 520 samples and holds the peak voltage across capacitor C4 to generate an output voltage VQ.

As illustrated in FIGS. 4A and 4B, current flows in the same direction along leg 475 when the PFC boost switch is off (synchronous switch is on). The primary winding L3 in FIG. 5 is connected long the same leg 475 so that current flows through the primary winding L3 of the current transformer CT when the inductor's current is charging capacitor C3 during both the positive and negative half-cycles. The flow of current in the primary winding L3 induces a corresponding current ICT in the secondary winding L4. Current ICT then flows through diode D53 to charge capacitor C4. In one embodiment, when the controller turns on the PFC boost switch (transistor Q41 in positive half-cycle, transistor Q42 in negative half-cycle), the controller also clocks the sample-and-hold 520 to sample the capacitor voltage VC and then, after a small delay, turns on transistor Q51 to discharge the capacitor C4. The output signal from the sample-and-hold 520 is VQ and represents the peak voltage of capacitor C4. Voltage VQ thus is a function of the current Iin and the amount of time that Iin is charging capacitor C3. Thus, VQ represents the amount of electric charge delivered to PFC circuit's output in each switching cycle. The controller 610 shown in FIG. 6 and described controls the magnitude of VQ and in so-doing controls the amount of electric charge delivered by the PFC circuit. The control technique thus is a charge-control technique.

Figure 6:
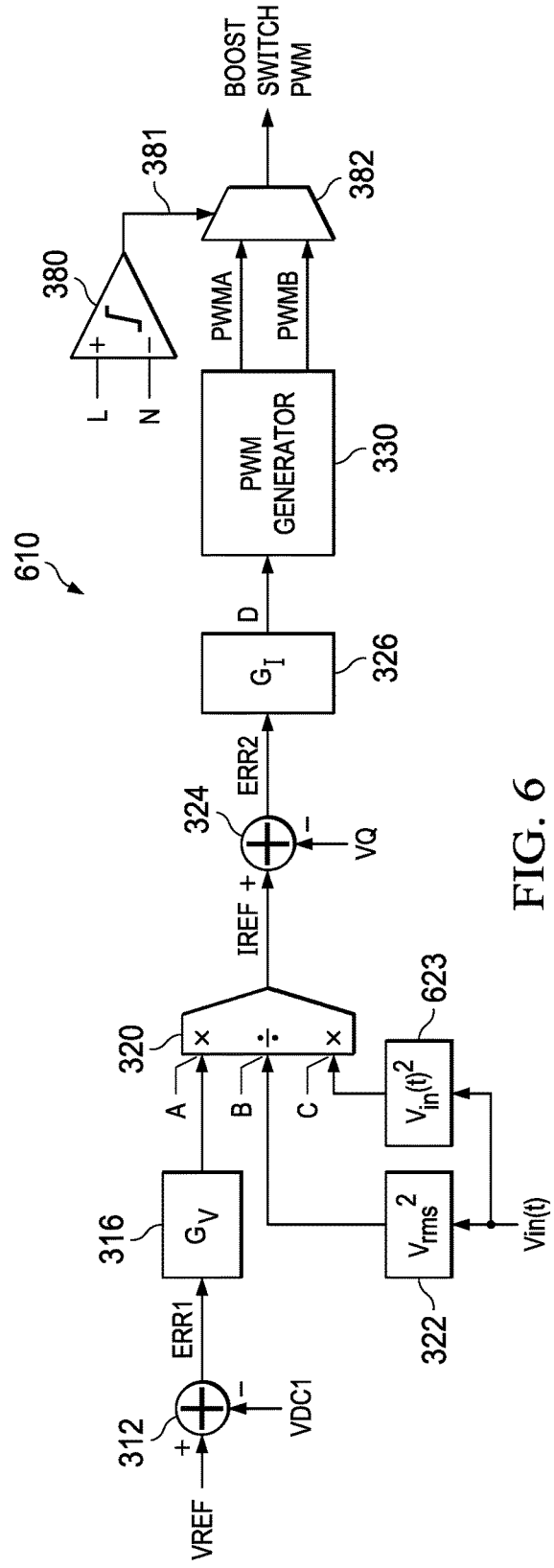
FIG. 6 is a schematic of a PFC controller usable in conjunction with the PFC circuit of FIG. 5.

FIG. 6 shows an example implementation of controller 610 for controlling transistors Q41 and Q42 in the PFC circuit 510 of FIG. 5. The output signals from PWM generator 330 includes a PWMA signal and a PWMB signal. PWMA is coupled to the gate of transistor Q42 and thus controls when transistor Q42 is on and off. Similarly, PWMB is coupled to the gate of transistor Q41 and thus controls when transistor Q41 is on and off. The boost switch PWM signal is PWMB in the AC positive half-cycle and PWMA in the AC negative half-cycle), and is coupled to the gate of transistor Q51 and to a clock input of the sample-and-hold 520.

The controller 610 also includes a comparator 380 and a multiplexer 382 to generate the boost switch PWM control signal for transistor Q51. The comparator 380 inputs receive the line (L) and neutral (N) voltages and generates a digital output signal 381 to a selection input of the multiplexer 282. The digital output signal 381 is logic high when L is larger than N and is logic low when L is smaller than N. The multiplexer 382 outputs the PWMA or PWMB signals as the boost switch PWM signal to transistor Q51 responsive to the logic level of the digital output signal 381.

The implementation of controller 610 is similar to that of controller 310 of FIG. 3, with several differences. One difference is that the controller 610 includes an input voltage square calculation circuit 623. The instantaneous input voltage Vin (t) is coupled to an input of the input voltage square calculation circuit 623. The input voltage square calculation circuit 623 determines the square of Vin (t) and provides a time-varying signal (the square of Vin) to the C input of multiplexer 320.

Figure 7A:
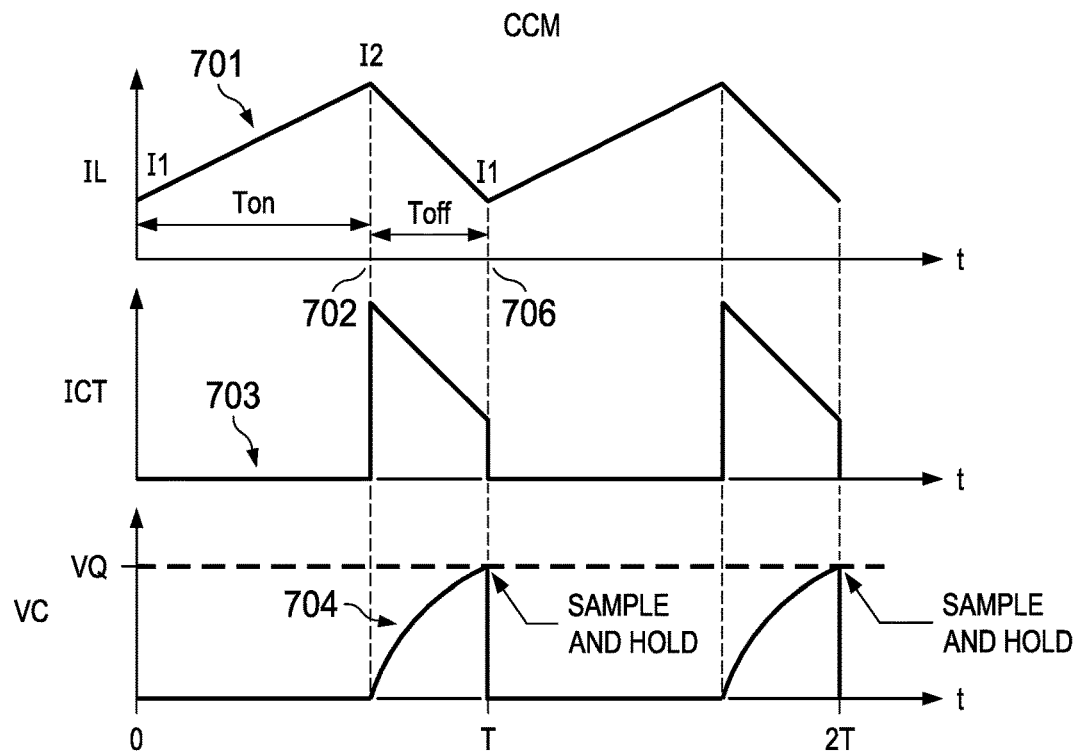
FIGS. 7A and 7B are illustrative waveforms of the operation of the PFC circuit of FIG. 5.
Figure 7B:
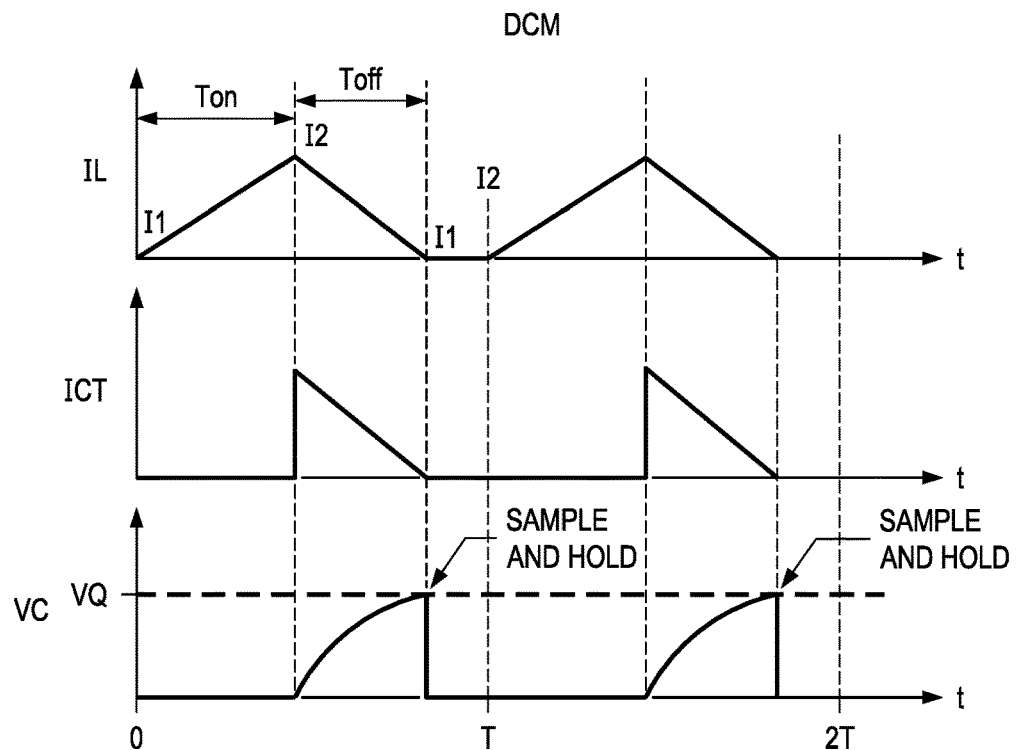

Another difference is that VQ is provided to the inverting input (−) of adder 324, rather than Iin as was the case for controller 310. The controller 610 controls the duty cycle of transistors Q41 and Q42 to cause the difference between IREF and VQ to be small. In this example, IREF is a function of the signals on the A, B, and C inputs of multiplier 320. IREF equals A*C/B. The magnitude of Iin is provided below in Eq. (1):

$$Iin = \frac{(I1 + I2) * Toff}{2 * T} \quad (1)$$

where I1 and I2 are the lower and upper values, respectively, of the inductor current (which also is Iin) as shown in FIGS. 7A and 7B and described below, Ton is turn-on time of the boost switch, Toff is time during which the synch switch is on, and T is the switching period. The peak voltage VQ across capacitor C4 in each switching cycle is:

$$VQ = \frac{(I1 + I2) * Toff}{2 * C4} \quad (2)$$

In the steady state, VQ equals IREF. For a boost converter in steady state operation, the volt-seconds applied to the boost inductor should be balanced in each switching period:

$$Ton*Vin=Toff*(VDC1-Vin) \quad (3)$$

Combining the relationships above, $$In = \frac{Gv * VDC1 * C4}{Vrms^2 * T} \quad (4)$$

where Gv is the gain of the transconductance amplifier 316. Because both C4 and T are constant, and A, VDC1 and Vrms² do not change in the steady state, it follows therefore that Iin changes as Vin (t) changes. When Vin (t) has a sinusoidal waveform, then Iin also is sinusoidal, and thus unity power factor is achieved. The example of FIG. 5 includes a current transformer CT to generate a current to charge capacitor C4. In another embodiment, a hall sensor can be used in place of the current transformer to generate a current to charge capacitor C4. In yet another example, a resistor coupled to a voltage-controlled current source can be used to generate the current to charge capacitor C4.

FIG. 7A illustrates example waveforms of the current through the inductor L2 (IL, which also is Iin), current ICT, VQ, and VC during the continuous conduction mode (CCM) in which the inductor current does not fall to zero. CCM is used for heavier load conditions. When the PFC boost switch (transistor Q41 in the positive half-cycle, transistor Q42 in the negative half-cycle) is on (Ton), the inductor current IL increases approximately linearly from I1 to I2. At 702, the controller 610 turns off the PFC boost switch and turns on the synchronous switch. As a result, the inductor current IL decreases linearly as shown. ICT is zero (703) when PFC boost switch is on and, via current transformer CT, approximates IL when the PFC boost switch is off and synchronous switch is on. Capacitor C4 charges when ICT ramps downward. The voltage VC on capacitor C4 increases as shown at 704 until time point 706 occurs at which time the controller 610 turns off synchronous switch and turns on boost switch. At that point in time, the controller 610 clocks sample-and-hold 520 to sample and hold VC as signal VQ. VQ is provided to the inverting input of adder 324 as explained above.

FIG. 7B illustrates example waveforms of IL, ICT, VQ, and VC during the discontinuous conduction mode (DCM) in which the inductor current falls to zero during each switching period. DCM is used for light load conditions. The operation of the controller 610 is largely the same, however, in terms of sampling and holding the voltage VC across capacitor C4 as signal VQ.

Figure 8:
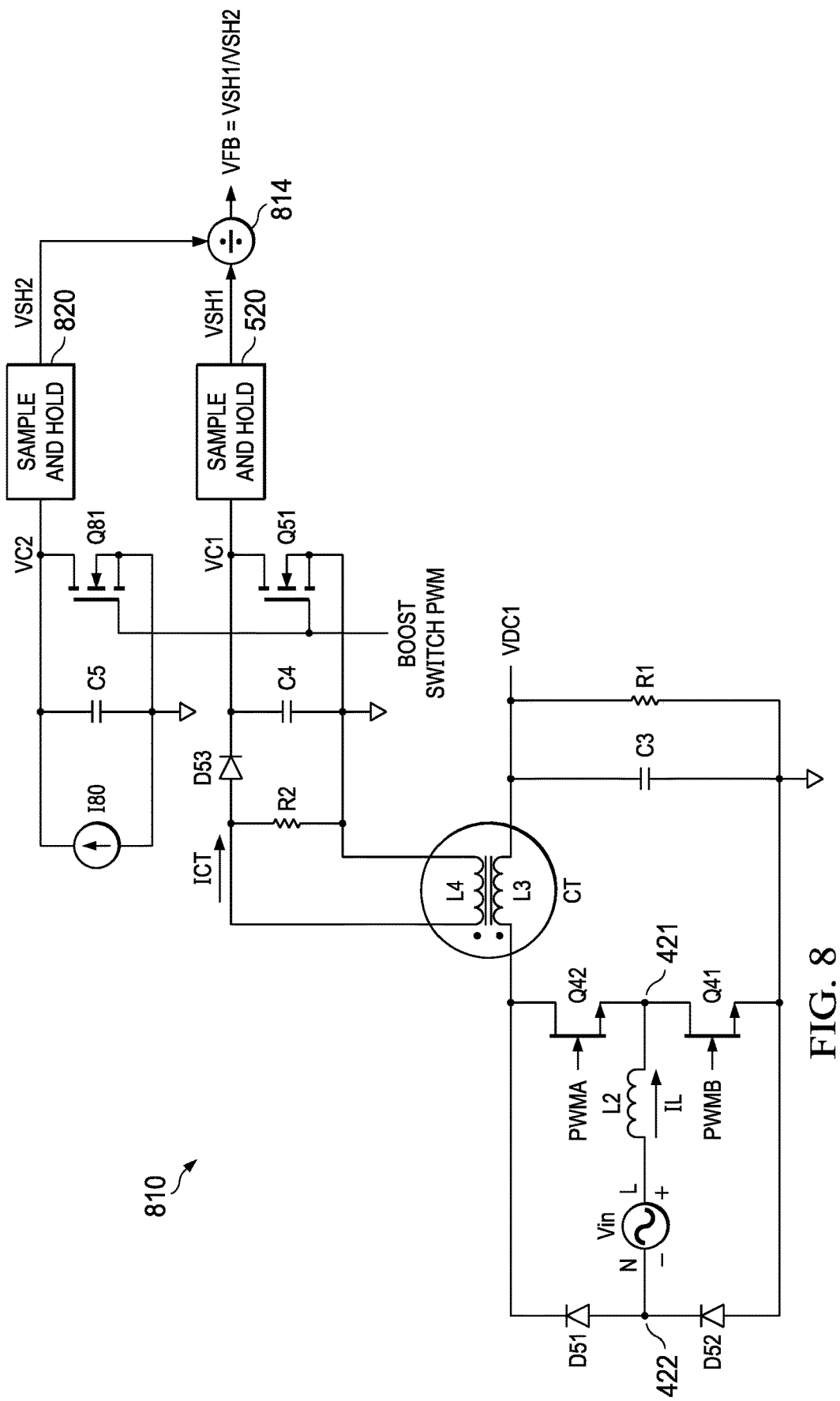
FIG. 8 is a circuit schematic of a PFC circuit including a current transformer, two sample-and-holds, and a divider in accordance with another example.

FIG. 8 shows an example of a PFC circuit 810 that is similar to PFC circuit 510 in FIG. 5, but may function better at higher current levels. A difference is that the PFC circuit 810 in FIG. 8 includes a current source 180, capacitor C5, transistor Q81, a second sample-and-hold 820, and an analog divider 814. Current source 180 provides a current (also designated 180) to charge capacitor C5 (the voltage across which is VC2) while PFC boost switch is off (synchronous switch is on). The gate of transistor Q81 is also controlled by boost switch PWM signal generated as described above. Sample-and-hold 820 samples and holds the peak voltage on capacitor C5 as output voltage VSH2. Sample-and-hold 520 samples and holds the peak voltage across capacitor C4 (labeled as VC1 in FIG. 8). The output signal from sample-and-hold 520 in FIG. 8 is labeled VSH1. Analog divider 814 produces an output signal, VFB, that is VSH1 divided by VSH2 (VSH1/VSH2). This extra division circuit eliminates the so-called Right-Half-Plane zero (which is inherent in a boost converter) from the current control loop, which makes the current loop compensation much easier to implement.

Figure 9:
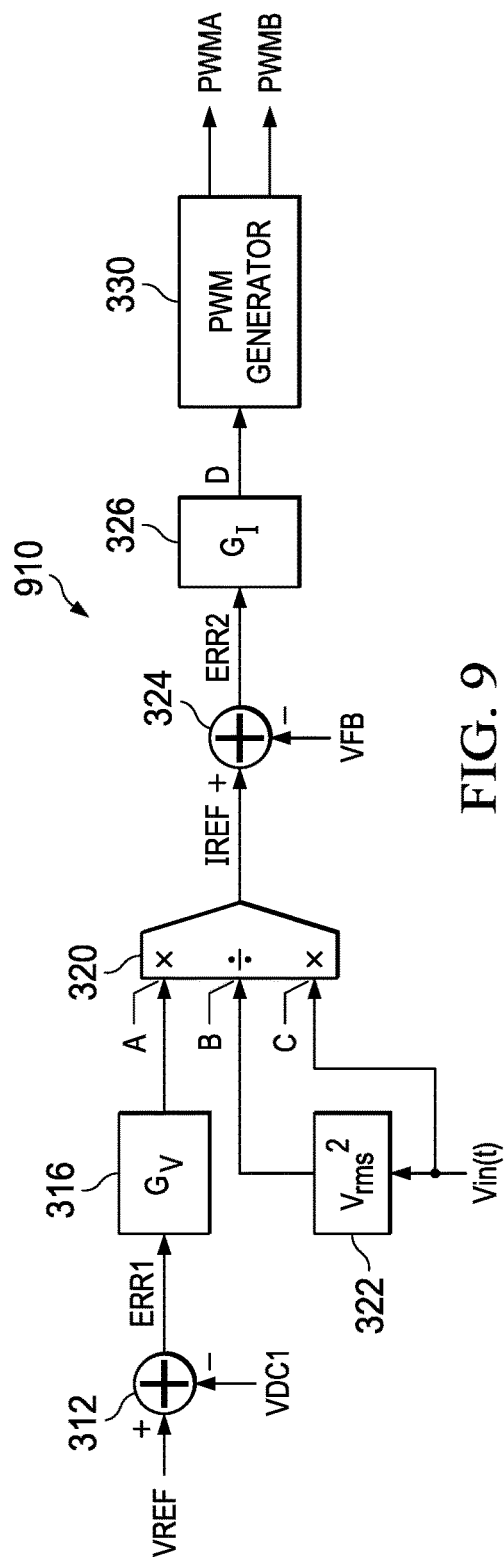
FIG. 9 is a schematic of a PFC controller usable in conjunction with the PFC circuit of FIG. 8.

FIG. 9 is a controller 910 usable in conjunction with PFC circuit 810. The controller 910 of FIG. 9 is largely the same as controller 310 of FIG. 3. However, rather than the inverting input of adder 324 receiving Iin, the inverting input of adder 324 is coupled to the output of analog divider 814 and thus receives signal VFB. Thus, controller 910 causes VFB to match IREF. The comparator 380 and multiplexer 382 to generate the boost switch PWM signal are not shown in FIG. 9 for simplicity but may be present in some embodiments.

Figure 10:
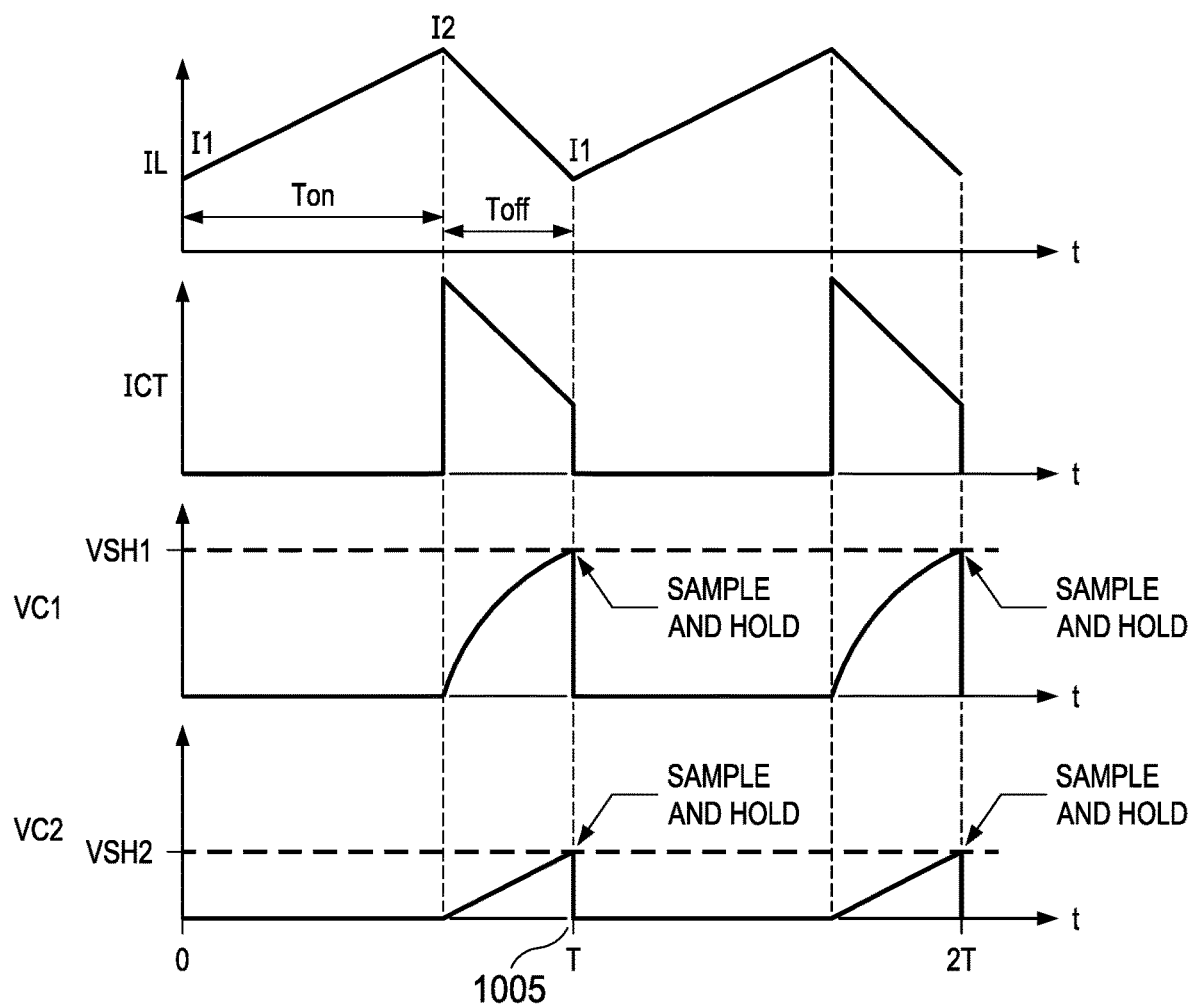
FIG. 10 are illustrative waveforms of the operation of the PFC circuit of FIG. 8.

FIG. 10 shows example waveforms for IL, ICT, VC1, and VC2. Sample-and-holds 520 and 820 are clocked at the same time and thus produce voltages VSH1 and VSH2 at the same time (1005).

Figure 12:
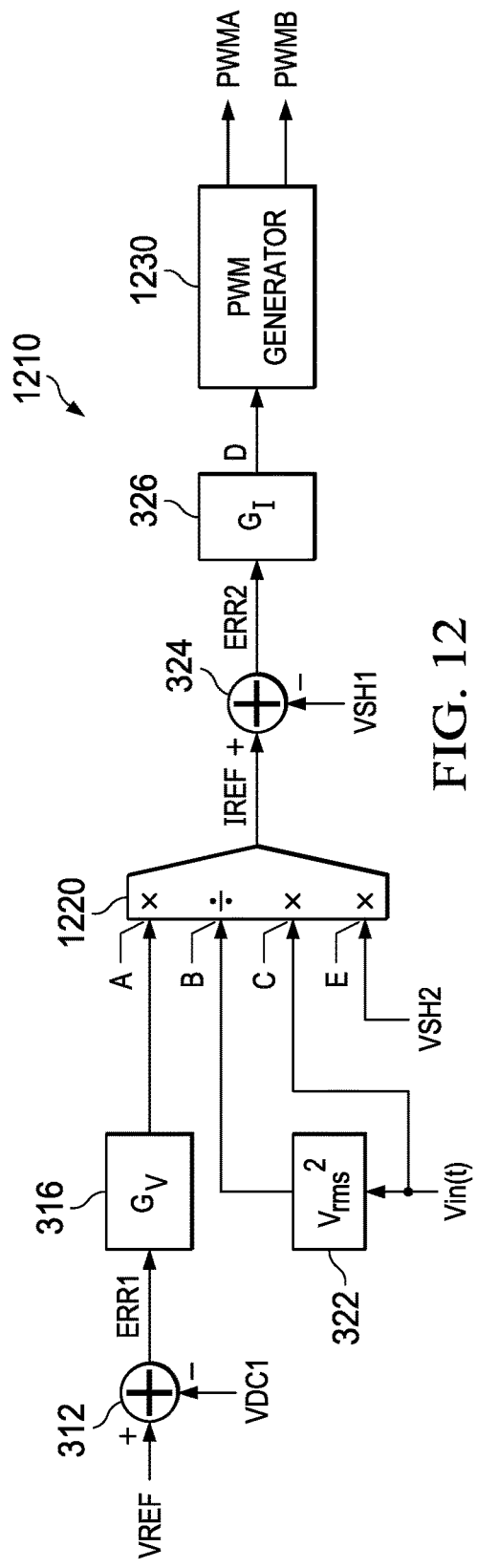
FIG. 12 is a schematic of a PFC controller usable in conjunction with the PFC circuit of FIG. 11.
Figure 11:
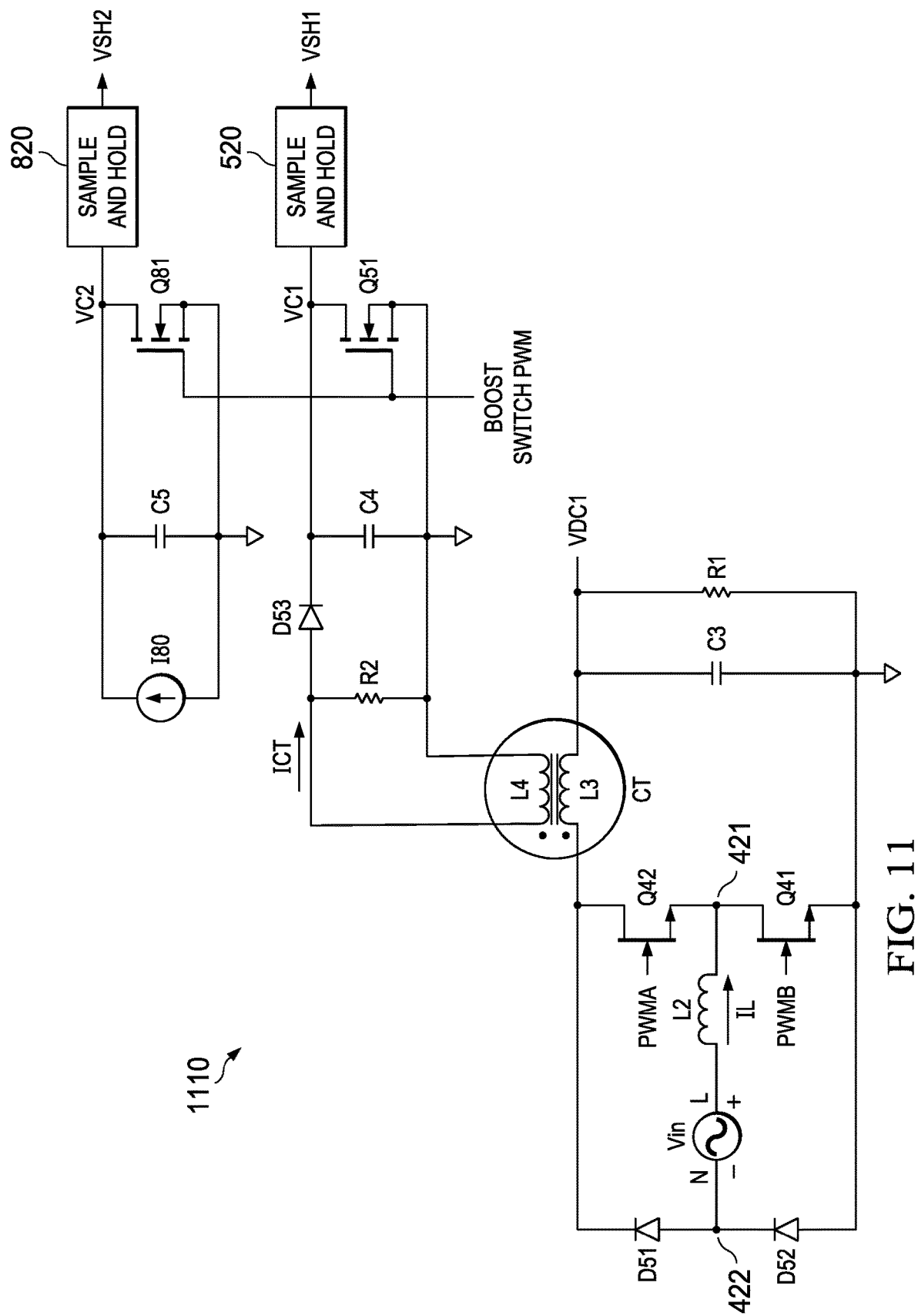
FIG. 11 is a circuit schematic of a PFC circuit including a current transformer and two sample-and-holds in accordance with another example.

FIG. 11 shows a PFC circuit 1110. A difference between PFC circuit 1110 and PFC circuit 810 is that PFC circuit 1110 does not include voltage divider 814. The outputs VSH1 and VSH2 of sample- and holds 520 and 820 are separately used as inputs to controller 1210 in FIG. 12. The controller 1210 in FIG. 12 is similar to the controller 910 described above. Multiplier in FIG. 12 has four inputs A-E. Inputs A, B, and C receive the same inputs as described above. Input E receives VSH2. The multiplier 1220 computes IREF to be A×C×E/B. The inverting input of adder 324 receives VSH1. Controller 1210 thus controls VSH1 to be approximately equal to IREF from multiplier 1220. The comparator 380 and multiplexer 382 to generate the boost switch PWM signal are not shown in FIG. 12 for simplicity but may be present in some embodiments.

Figure 13:
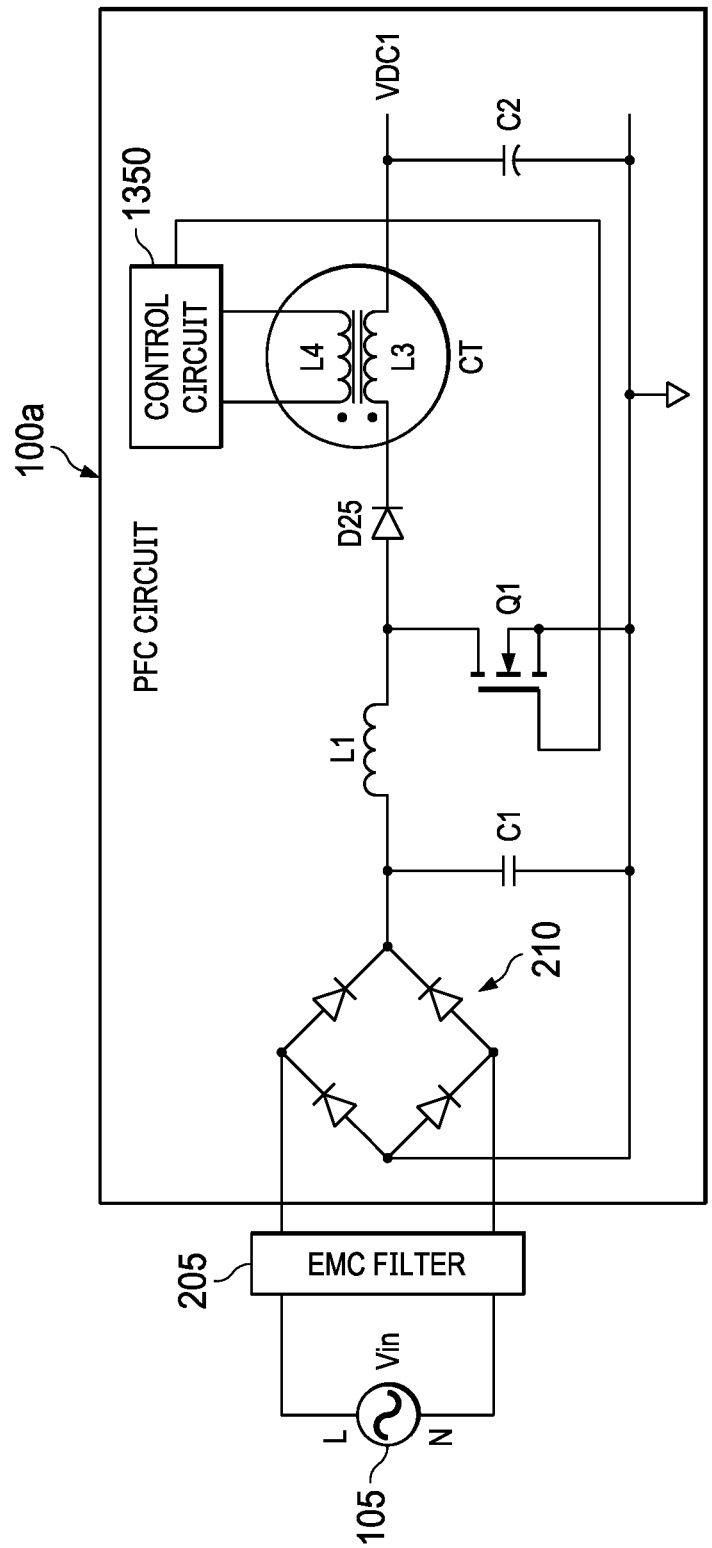
FIG. 13 is a schematic of a bridge-based PFC circuit and an associated controller in accordance with an example.

FIG. 13 shows the bridge-based PFC circuit 100a to which a current transformer CT has been coupled. The current transformer CT is coupled to the cathode of diode D25. The current transformer CT is coupled to a control circuit 1350. The control circuit 1350 includes any of the combination of components described above connected to the current transformer, as well as any of the corresponding controllers also described above. The control techniques described above thus apply to bridge-based PFC circuits as well as bridge-less PFC circuits.

In one embodiment, each of the various controllers 310, 610, 910, and 1210 may be fabricated on a single die. That is, controller 310 may be fabricated on a die, controller 610 may be fabricated on a die, and so on. Further, in the embodiment of FIGS. 5 and 6 the sample-and-hold 520 may be fabricated on the same die as controller 610. In the embodiment of FIGS. 8 and 9, any or all of sample-and-holds 520 and 820, divider 814, current source 180, capacitor C5, and transistor Q81 may be fabricated on the same die as controller 910. In the embodiment of FIGS. 11 and 12, any or all of sample-and-holds 520 and 820, current source 180, capacitor C5, and transistor Q81 may be fabricated on the same die as controller 1210.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon field effect transistor ("MOSFET") may be used in place of an n-type MOSFET with little or no changes to the circuit. Furthermore, other types of transistors may be used (such as bipolar junction transistors (BJTs), gallium nitride (GAN) transistors, etc.).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

Modifications are possible in the described embodiments, and other embodiments are possible, within the scope of the claims.

What is claimed is:

1. An apparatus comprising:
   an arithmetic circuit including a first input, a second input, a third input, and an output;
   an adder circuit including a first input, a second input, and an output, the first input of the adder circuit is coupled to the output of the arithmetic circuit, and the second input of the adder circuit is configured to receive a first voltage;
   a root mean square (RMS) calculation circuit including:
      an output coupled to the second input of the arithmetic circuit; and
      an input configured to receive a second voltage; and
   an input voltage square calculation circuit including:
      an output coupled to the third input of the arithmetic circuit; and
      an input configured to receive the second voltage.

2. The apparatus of claim 1, further including:
   a first transconductance amplifier including an input coupled to the output of the adder circuit, and an output.

3. The apparatus of claim 2, further including:
   a pulse width modulation generator including:
      an input coupled to the output of the first transconductance amplifier;
      a first output; and
      a second output.

4. The apparatus of claim 3, further including:
   a multiplexer including:
      a first input coupled to the first output of the pulse width modulation generator;
      a second input coupled to the second output of the pulse width modulation generator;
      a third input; and
      an output.

5. The apparatus of claim 4, further including:
   a comparator including:
      a first input configured to receive a line voltage;
      a second input configured to receive a neutral voltage; and
      an output coupled to the third input of the multiplexer, wherein a digital output signal on the output of the comparator is logical high in response to the line voltage having a larger value than the neutral voltage, and wherein the digital output signal on the output of the comparator is logical low in response to the line voltage signal having a smaller value than the neutral voltage.

6. The apparatus of claim 1, further including:
   a second transconductance amplifier including:
      an input configured to receive an error signal; and
      an output coupled to the first input of the arithmetic circuit, and an input.

7. The apparatus of claim 6, wherein:
   the error signal indicates a voltage difference between a reference voltage and a third voltage.

8. The apparatus of claim 1, wherein:
   the input voltage square calculation circuit is configured to square the second voltage to determine a time-varying signal at the output of the input voltage square calculation circuit.

9. A system comprising:
   a control circuit including:
      an arithmetic circuit including a first input, a second input, a third input, and an output;
      an adder circuit including a first input, a second input, and an output, the first input of the adder circuit is coupled to the output of the arithmetic circuit, and the second input of the adder circuit is configured to receive a first voltage;
      a root mean square (RMS) calculation circuit including:
         an output coupled to the second input of the arithmetic circuit; and
         an input configured to receive a second voltage; and
      an input voltage square calculation circuit including:
         an output coupled to the third input of the arithmetic circuit; and
         an input configured to receive the second voltage; and
   a power factor correction circuit coupled to the control circuit, the power factor correction circuit including:
      a capacitor; and
      a sample and hold circuit including an input coupled to the capacitor, and an output.

10. The system of claim 9, wherein:
    the sample and hold circuit is configured to determine the first voltage; and
    the first voltage is a peak voltage across the capacitor.

11. The system of claim 9, wherein:
    the power factor correction circuit includes a transformer including a primary side and a secondary side, wherein the secondary side is coupled in parallel to the capacitor.

12. The system of claim 11, wherein:
    the power factor correction circuit includes a transistor including a control terminal coupled to the control circuit, a first terminal coupled to the sample and hold circuit and the capacitor, and a second terminal coupled to the capacitor.

13. The system of claim 9, wherein:
    the arithmetic circuit is configured to multiply a first signal on the first input of the arithmetic circuit by a third signal on the third input of the arithmetic circuit to determine a result; and
    the arithmetic circuit is configured to divide the result by a second signal on the second input of the arithmetic circuit.

14. The system of claim 9, further including:
a first transconductance amplifier including an input coupled to the output of the adder circuit, and an output.

15. The system of claim 14, further including:
a pulse width modulation generator including:
   an input coupled to the output of the first transconductance amplifier;
   a first output; and
   a second output.

16. The system of claim 15, wherein:
the power factor correction circuit includes:
   a first switch including a control input coupled to the first output of the pulse width modulation generator; and
   a second switch including a control input coupled to the second output of the pulse width modulation generator.

17. The system of claim 9, wherein:
the sample and hold circuit is a first sample and hold circuit; and
the power factor correction circuit includes a second sample and hold circuit coupled to the first sample and hold circuit.

18. A system comprising:
a control circuit including:
   an arithmetic circuit including a first input, a second input, a third input, a fourth input, and an output;
   an adder circuit including a first input, a second input, and an output, the first input of the adder circuit is coupled to the output of the arithmetic circuit, and the second input of the adder circuit is configured to receive a first voltage; and
   a root mean square (RMS) calculation circuit including:
      an output coupled to the second input of the arithmetic circuit; and
      an input configured to receive a second voltage; and
a power factor correction circuit coupled to the control circuit, the power factor correction circuit including:
   a first capacitor;
   a second capacitor;
   a first sample and hold circuit including an input coupled to the first capacitor, and an output; and
   a second sample and hold circuit including an input coupled to the second capacitor, and an output.

19. The system of claim 18, wherein:
the first input of the arithmetic circuit is configured to receive a third voltage;
the third input of the arithmetic circuit is configured to receive the second voltage;
the fourth input of the arithmetic circuit is coupled to the output of the second sample and hold circuit.

20. The system of claim 19, wherein:
the second input of the adder circuit is coupled to the first sample and hold circuit.

* * * * *